(12) United States Patent
Li

(10) Patent No.: US 11,176,349 B1
(45) Date of Patent: Nov. 16, 2021

(54) DISPLAY SCREEN AND ELECTRONIC DEVICE

(71) Applicant: BEIJING XIAOMI MOBILE SOFTWARE CO., LTD., Beijing (CN)

(72) Inventor: Jinze Li, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/099,593

(22) Filed: Nov. 16, 2020

(30) Foreign Application Priority Data

Jun. 29, 2020 (CN) .......................... 202010604183.3

(51) Int. Cl.
*G06K 9/00* (2006.01)
*G09G 3/00* (2006.01)
*G09G 3/3208* (2016.01)

(52) U.S. Cl.
CPC ......... *G06K 9/00053* (2013.01); *G09G 3/007* (2013.01); *G09G 3/3208* (2013.01)

(58) Field of Classification Search
CPC ........... G06K 9/00053; G06K 9/00013; G06K 9/0004; G09G 3/007; G09G 3/3208; G09G 3/38; G02F 1/1525; G02F 1/1334; G02F 1/133337; G02F 2001/164; G02F 1/15; G02F 1/163; G02B 5/23; H01L 27/3232; H01L 27/14678; H01L 27/3234; G09F 9/00; G09F 9/301
See application file for complete search history.

(56) References Cited

U.S. PATENT DOCUMENTS

| | | | | |
|---|---|---|---|---|
| 2011/0279884 | A1* | 11/2011 | Fujimura | G02F 1/1525 359/270 |
| 2015/0078634 | A1* | 3/2015 | Mankowski | H05B 45/20 382/124 |
| 2019/0156094 | A1 | 5/2019 | Du et al. | |
| 2019/0205600 | A1 | 7/2019 | Kim | |

FOREIGN PATENT DOCUMENTS

| | | | |
|---|---|---|---|
| CN | 108983521 A | * | 12/2018 |
| KR | 20190079159 A | | 7/2019 |
| WO | WO-2020192413 A1 | * | 10/2020 |

OTHER PUBLICATIONS

Extended European Search Report (EESR) in application No. 20211065.6 dated May 28, 2021.

* cited by examiner

*Primary Examiner* — Abhishek Sarma
(74) *Attorney, Agent, or Firm* — Syncoda LLC; Feng Ma

(57) ABSTRACT

A display screen for an electronic device having an under-screen fingerprint collection component includes a substrate, and a color shifting layer arranged to the substrate The color shifting layer is made of a photochromic material. The color shifting layer covers at least a portion of the substrate corresponding to the under-screen fingerprint collection component.

8 Claims, 2 Drawing Sheets

DISPLAY SCREEN AND ELECTRONIC DEVICE

CROSS-REFERENCE TO RELATED APPLICATION

The present application claims priority to Chinese Patent Application No. 202010604183.3 filed on Jun. 29, 2020, the disclosure of which is hereby incorporated by reference in its entirety.

BACKGROUND

With the development of technology, the area of the display screen is getting larger and larger to provide users with better visual enjoyment. In order to increase the screen-to-body ratio of electronic devices such as mobile phones, cameras, fingerprint collection modules, etc. can be moved to the bottom of the display.

SUMMARY

According to embodiments of a first aspect of the present disclosure, there is provided a display screen for an electronic device having an under-screen fingerprint collection component. The display screen includes a substrate and a color shifting layer arranged to the substrate. The color shifting layer is made of a photochromic material. The color shifting layer covers at least a region of the substrate corresponding to the under-screen fingerprint collection component.

According to embodiments of a second aspect of the present disclosure, there is provided an electronic device, including a display screen and a fingerprint collection component arranged below the display screen. The display screen includes a substrate and a color shifting layer arranged over the substrate. The color shifting layer is made of a photochromic material. The color shifting layer covers at least a region of the substrate corresponding to the fingerprint collection component.

It should be understood that the above general description and the following detailed description are only illustrative and explanatory, and cannot limit the present disclosure.

BRIEF DESCRIPTION OF THE DRAWINGS

The drawings are incorporated into the specification and constitute a part of the disclosure, showing embodiments in accordance with the present disclosure, and together with the specification are used to explain the principle of the present disclosure.

DETAILED DESCRIPTION

Figure 1:
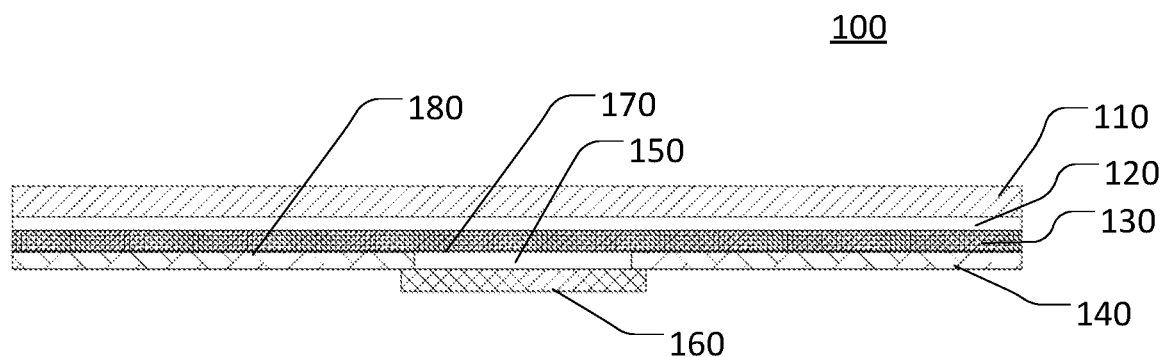
FIG. 1 is a schematic view of a display screen according to some embodiments.

Here, illustrative embodiments will be described in detail, and examples thereof are illustrated in the drawings. When the following description refers to the drawings, unless otherwise indicated, the same numbers in different drawings indicate the same or similar elements. The implementations described in the following illustrative embodiments do not represent all implementations consistent with the present disclosure. Rather, they are merely examples of devices and methods consistent with some aspects of the present disclosure as detailed in the appended claims.

In the related art, a screen used by a mobile phone, a pad and other electronic devices is generally a liquid crystal display (LCD) screen or an organic light-emitting diode (OLED) screen. Since the light-emitting principle of the OLED screen is different from that of the LCD screen, the OLED screen has advantages of smaller thickness, larger bendability, less power consumption, and more delicate colors, compared with the LCD screen, such that the OLED screen is widely acclaimed.

With the development of technology, the area of the display screen is getting larger and larger to provide users with better visual enjoyment. In order to increase a screen-to-body ratio of the electronic device such as the mobile phone, the design schemes of auxiliary functional components such as a camera and a fingerprint collection component have also changed accordingly. For the fingerprint collection component, there are mainly three arrangement schemes in the related art, namely a front arrangement, a rear arrangement and an under-screen arrangement. However, with the advent of the full-screen era, the schemes of the rear arrangement and the under-screen arrangement of the fingerprint collection component have become mainstream.

For the under-screen fingerprint collection component of the OLED screen, the current mainstream scheme is to arrange an optical sensor under the OLED screen. In order to ensure that the light from the optical sensor can effectively pass through the OLED screen, that is to increase the light transmittance of the optical sensor, it is required to dig a hole in the auxiliary material on a side of the OLED screen facing an interior of the electronic device, and the optical sensor is arranged to correspond to the dug hole. Moreover, in order to ensure the display brightness of the display screen, a layer of reflective material is coated on the side of the display screen facing the interior of the electronic device so as to reflect the light passing through the display screen onto the reflective material, thus improving the display brightness of the display screen. However, in order to increase the light transmittance of the optical sensor, the reflective material is not coated on a portion of the display screen corresponding to the optical sensor.

Since some regions of the display screen are provided with the reflective material and some other regions of the display screen are not provided with the reflective material, the regions provided with the reflective material can reflect the light, and the regions without the reflective material cannot reflect the external light. Therefore, the region with the reflective material and the region without the reflective material have different reflection degrees of light when the display screen is in the sun. The brightness of the region with the reflective material will be higher than that of the region without the reflective material in sunlight, such that the region without the reflective material, that is, the region where the optical sensor is arranged forms a display dark spot.

Specifically, for the under-screen fingerprint collection solution of an OLED screen, a user may find during the use process that the position of the optical sensor of the display screen will appear dark spots in the sun, which affects the user experience.

As illustrated in FIG. 1, an OLED screen 100 can include a glass cover 110 and a display panel 130 adhered and connected by an optical glue layer 120. The OLED screen 100 also includes an auxiliary material 140 on a side of the display panel 130 away from the glass cover 110. The auxiliary material 140 has a light-transparent hole 150, and an optical sensor 160 is arranged at a side of the auxiliary material 140 away from the glass cover 110. The optical sensor 160 and the light-transparent hole 150 are arranged correspondingly. The side of the display panel 130 of the OLED screen 100 away from the glass cover 110 is divided into two regions, namely a first region 170 and a second region 180. The first region 170 is a region of the display panel 130 corresponding to a region of the auxiliary material 140 provided with the light-transparent hole 150, and the reflective material is not provided at the first region 170. The second region 180 is another region of the display panel 130 corresponding to another region of the auxiliary material 140 not provided with the light transparent hole 150, and a reflective layer formed by the reflective material (not illustrated in the drawings) is provided at the second region 180. When the OLED screen 100 is in sunlight, since the first region 170 is not provided with the reflective material, the first region 170 cannot reflect the ambient light incident on the OLED screen 100 from the external environment, and thus the dark spot is formed at the first region 170.

The present disclosure provides a display screen for an electronic device having an under-screen fingerprint collection component. The display screen is an OLED screen, and includes a substrate. The substrate is provided with a color shifting layer, and the color shifting layer is made of a photochromic material. The color shifting layer covers at least a region of the substrate corresponding to a fingerprint collection component. With the color shifting layer made of the photochromic material being arranged on the substrate of the OLED screen, the region of the display screen corresponding the fingerprint collection component and the other regions of the display screen can have substantially the same reflection effect in sunlight, which prevents the dark spot from appearing in a fingerprint collection region of the OLED screen in sunlight and hence improves the user experience.

In some embodiments, it is required that a wavelength at which the photochromic material can be excited does not fall into a self-luminous band of the material of the OLED screen. The photochromic material is in a colorless and transparent state without being excited, and is in a nontransparent state when being excited.

Figure 2:
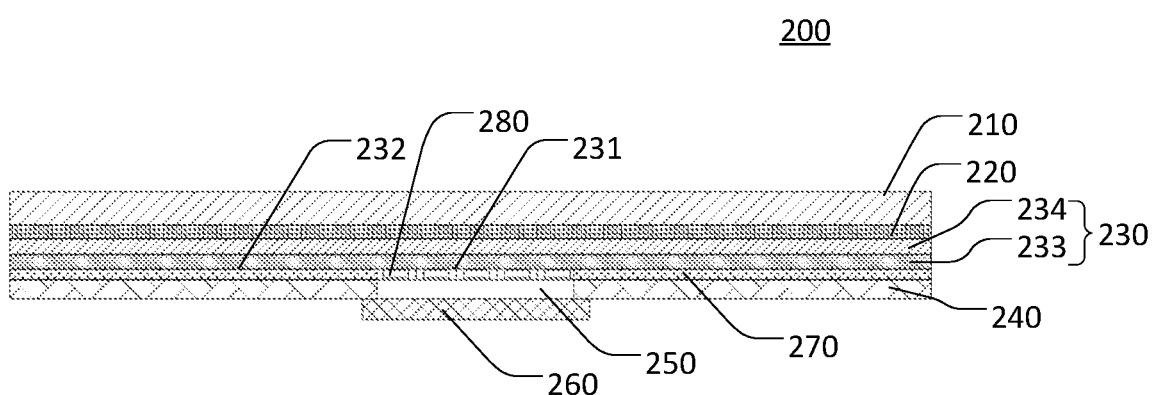
FIG. 2 is a schematic view of a display screen according to some embodiments.

In some embodiments, as illustrated in FIG. 2, the display screen of this embodiment may be a rigid OLED screen, and also may be a flexible OLED screen. The upper, lower and other orientations involved in descriptions of this embodiment are based on the orientation illustrated in FIG. 2.

An OLED screen 200 of this embodiment includes a glass cover 210 and a display panel 230 connected by an optical glue layer 220. The OLED screen 200 also includes an auxiliary material 240 configured at a side of the display panel 230 away from the glass cover 210. That is, from top to bottom, the OLED screen 200 includes the glass cover 210, the optical glue layer 220, the display panel 230, and the auxiliary material 240 in turn. The auxiliary material 240 has a light-transparent hole 250. The auxiliary material 240 may be foam, etc. A fingerprint collection component 260 is provided at a side of the auxiliary material 240 away from the glass cover 210. The fingerprint collection component 260 may be an optical sensor, for example, and the optical sensor is arranged corresponding to the light-transparent hole 250. The side of the display panel 230 of the OLED screen 200 away from the glass cover 210 is divided into two areas, namely a first region 231 and a second region 232. The first region 231 is a region of the display panel 230 corresponding to a region of the auxiliary material 240 provided with the light-transparent hole 250, and the first region 231 is not provided with a reflective layer 270 formed by the reflective material. The second region 232 is another region of the display panel 230 corresponding to another region of the auxiliary material 240 not provided with the light-transparent hole 250, and the second region 232 is provided with the reflective layer 270 formed by the reflective material.

The display panel 230 of this embodiment includes a substrate 233 provided with a color shifting layer 280 made of a photochromic material, and the color shifting layer 280 covers at least a region of the substrate 233 corresponding to the fingerprint collection component 260. The fingerprint collection component 260 may be the optical sensor, for example. In an example, as illustrated in FIG. 2, the display panel 230 includes a display encapsulation layer 234 and the substrate 233 arranged below the display encapsulation layer 234. The color shifting layer 280 is arranged to a side of the substrate 233 facing an interior of the electronic device (not illustrated in the drawings), that is, the color shifting layer 280 is arranged to a lower surface of the substrate 233.

As can be known from the above descriptions in the related art, since the first region 231 where the light-transparent hole 250 is formed is not provided with the reflective material and the second region 232 where the light-transparent hole 250 is not formed is provided with the reflective material, the first region 231 is darker than the second region 232 in sunlight and thus the dark spot is formed. In this embodiment, the color shifting layer 280 is arranged to the portion of the substrate 233 corresponding to the first region 231 and can change according the light received through the first region 231. The color shifting layer 280 becomes nontransparent and has a reflection function to be able to reflect the incident light through the display screen, when the color shifting layer 280 can be excited by the light received through the first region 231. The color shifting layer 280 always keeps colorless and transparent and has a great transmittance, when the color shifting layer 280 cannot be excited by the light received through the first region 231.

In this embodiment, after the color shifting layer 280 is arranged at a position corresponding to the first region 231, the color shifting layer 280 can reflect about 80% of the light received thereby when the display screen is in sunlight and the color shifting layer is excited, thus generating a reflection effect substantially the same with that of the region of the substrate 233 provided with the reflective layer 270. Therefore, the whole display screen has a great consistency of the display effect without the dark spot, which improves the user experience.

In this embodiment, three basic principles need to obey when the photochromic material used for the color shifting layer 280 is to be selected. First, the photochromic material should be nontransparent under the irradiation of the non-visible light, that is, in an excited state, so as to enable the region provided with the color shifting layer and corresponding to the fingerprint collection component to reflect the light like the other portion of the display screen. Second, the photochromic material should be colorless and transparent in an unexcited state, so as to enable the fingerprint collection component to perform the fingerprint collection. Third, the time required for the switching process between the excited state and the unexcited state of the photochromic material should not be too long, so as not to affect the user experience.

Based on the above three basic principles, an organic or inorganic photochromic material excited by a non-visible light may be selected according to actual situations so as to prepare the color shifting layer 280.

In some embodiments, also as illustrated in FIG. 2, the display screen of this embodiment is substantially the same with that of the above embodiment, and only differs in that the color shifting layer 280 in this embodiment is made of the organic photochromic material excited by the non-visible light. The color shifting layer 280 is colorless and transparent in the unexcited state, while is nontransparent and has the reflection function in the excited state. As can be known from the display principle of the OLED screen 200, the light of the OLED screen 200 is produced by the self-luminous material under the action of a voltage, and has a wavelength within a wavelength range of the visible light, that is, the light produced by the display screen is the visible light. In order to avoid the self-luminous band (780 nm to 400 nm) of the OLED screen 200 and prevent the photochromic reaction of the color shifting layer 280 from being affected by the visible light produced by the display screen, the organic photochromic material excited by the non-visible light should be selected when selecting the organic photochromic material to prepare the color shifting layer 280, so as to prevent the color shifting layer 280 from being excited by mistake. For example, the non-visible light may be an ultraviolet light, an infrared light, a far infrared light, etc.

The non-visible light of the natural light contains more ultraviolet light, so the color shifting layer 280 may be made of the organic photochromic material excited by the ultraviolet light, so as to enable the color shifting layer 280 to have a better effect and to improve the reliability and accuracy of usage. The color shifting layer 280 in this embodiment is made of the organic photochromic material excited by the ultraviolet light, and the organic photochromic material can only be excited by the ultraviolet light. The wavelength range of the ultraviolet light is 10 nm to 400 nm, which can effectively avoid the self-luminous band of the OLED screen 200. When the display screen is exposed to the sunlight, the color shifting layer of the display screen becomes nontransparent and has the reflection function to reflect the received light, that is having the same effect as the reflective material, which can avoid the dark spot of the display screen in sunlight and enhance the brand competitiveness.

During implementation, the color shifting layer 280 may be made of an organic photochromic material containing spirooxazine and also may be made of an organic photochromic material containing spiropyran. The above two organic photochromic materials are common materials in the related art and can be obtained through purchase. Since the organic photochromic material is selected to prepare the color shifting layer 280, the damping periods of the photochromic reaction and its reverse reaction of the color shifting layer 280 can be reduced to be more than ten micro seconds and less than twenty micro seconds, such that the color shifting layer 280 can be quickly switched between the excited state and the unexcited state after the ultraviolet light is received or the ultraviolet light disappears. Therefore, a quick unlocking can also be achieved in sunlight, and an unlocking speed is increased. According to related experiments, when the color shifting layer 280 of this embodiment is used, it is ensured that the time of the color shifting layer being switched between the excited state and the unexcited state ranges from 0.5 to 1 second.

In this embodiment, the color shifting layer 280 may be arranged to the substrate 233 by means of vacuum evaporation. The vacuum evaporation is a processing method, in which a certain heating and evaporation method is used to evaporate and vaporize a coating material (i.e. the organic photochromic material) under a vacuum condition, and then particles fly to a surface of the substrate and cohere into a film. The evaporation is a vapor deposition technology which is used early and widely, and has advantages of the simple forming method of the film, the high purity and compactness of the film, and the unique structure and performance of the film, etc.

Figure 3:
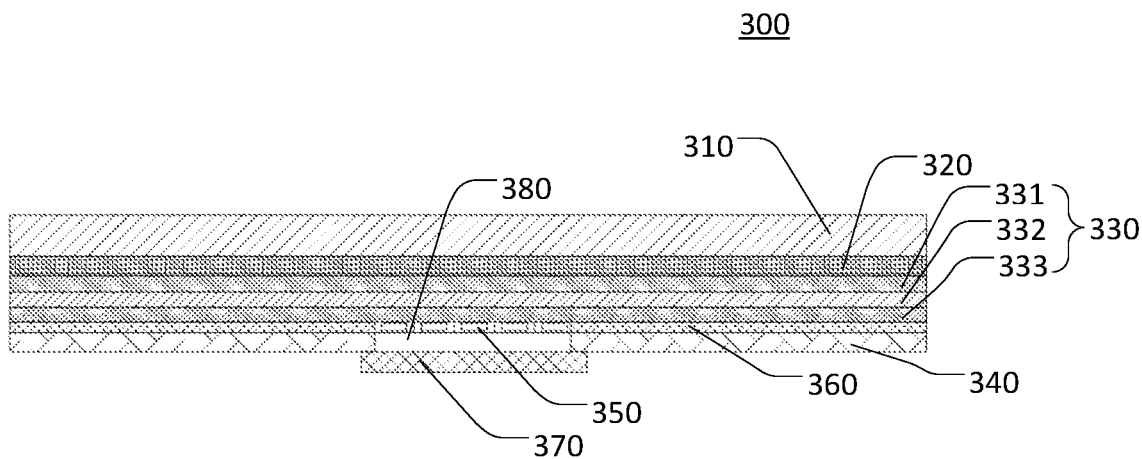
FIG. 3 is a schematic view of a display screen according to some embodiments.

In some embodiments, also as illustrated in FIG. 3, an OLED screen 300 of this embodiment is a rigid OLED screen. The rigid OLED screen includes a glass cover 310 and a display panel 330 connected by an optical glue layer 320. The OLED screen 300 also includes an auxiliary material 340 arranged at a side of the display panel 330 away from the glass cover 310. That is, from top to bottom, the display screen includes the glass cover 310, the optical glue layer 320, the display panel 330, and the auxiliary material 340 in turn. The display panel 330 includes a first glass substrate 331, a second glass substrate 333, and a display encapsulation layer 332 arranged between the first glass substrate 331 and the second glass substrate 333. The second glass substrate 333 is arranged at a side of the display encapsulation layer 332 facing the interior of the electronic device (not illustrated in the drawings), and a color shifting layer 350 is arranged at a side of the second glass substrate 333 facing the interior of the electronic device. Moreover, a reflective layer 360 formed by reflective materials is arranged at a lower surface of the second glass substrate 333. In this embodiment, the position of the color shifting layer 350 corresponds to that of the fingerprint collection component 370, that is, the location and size of a region of the auxiliary material 340 where a light-transparent hole 380 is formed for the fingerprint collection of the fingerprint collection component 370 match with those of the color shifting layer 350. In this way, the cost of the color shifting layer 350 can be saved and the dark spot can be avoided.

In this embodiment, the color shifting layer 350 is made of the ultraviolet photochromic material, for example, the organic photochromic material containing spirooxazine. When the display screen receives a strong light in an outdoor environment, much ultraviolet light is received, then the organic photochromic material absorbs the ultraviolet light and the photochromic reaction of the color shifting layer 350 is excited. That is, the color shifting layer 350 is in an excited state, i.e., a highly reflective state. In the excited state, the color shifting layer 350 becomes a reflective layer having a high reflectivity. In this case, the reflectivity of the color shifting layer 350 may be about 80% of that of the reflective material. Thus, when the display screen is observed by the user under the strong light, there is little light-dark difference between the region where the color shifting layer 350 is and the region coated by the reflective layer 360, which avoids the dark spot at the fingerprint collection region and improves the visible aesthetics of the display screen under the light.

Building materials such as glass will block the ultraviolet light of the sunlight when the user moves from the outdoor environment into the indoor environment, so the amount of the ultraviolet light in the room is very low, which is not enough to excite the organic photochromic material. In this case, the color shifting layer 350 is in an unexcited state. In this state, the color shifting layer 350 is transparent and colorless, has good light transmittance, and hardly reflects the light incident on it. Moreover, the color shifting layer also will not block the light emitted by the optical sensor used as the fingerprint collection component 370, such that the light emitted by the optical sensor can act on the fingerprint of the user without being blocked when fingerprint information needs to be collected, thus improving the accuracy and efficiency of fingerprint collection.

Certainly, it is understandable that the color shifting layer 280 of this embodiment may also be made of a photochromic material excited by an infrared light, rather than the photochromic material excited by the ultraviolet light, that is, an infrared photosensitive material in the photochromic materials, such as diarylethene photochromic compounds.

Figure 4:
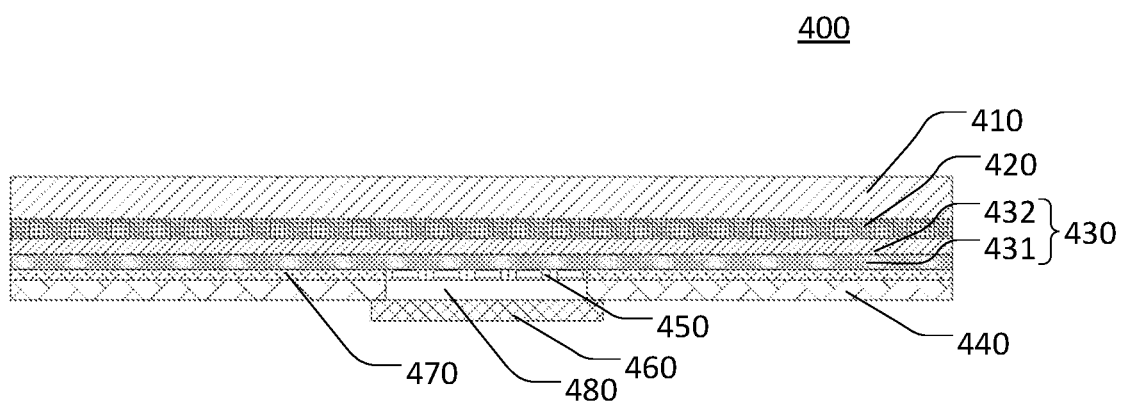
FIG. 4 is a schematic view of a display screen according to some embodiments.

In some embodiments, also as illustrated in FIG. 4, the OLED screen 400 of this embodiment is a flexible OLED screen. The flexible OLED screen includes a glass cover 410 and a display panel 430 connected by an optical glue layer 420. The OLED screen 400 also includes an auxiliary material 440 at a side of the display panel 430 away from the glass cover 410. That is, from top to bottom, the OLED screen 400 includes the glass cover 410, the optical glue layer 420, the display panel 430, and the auxiliary material 440 in turn. The display panel 430 includes a flexible substrate 431 and the flexible substrate 431 is a polyimide film, that is, a PI film. An upper surface of the flexible substrate 431 is coated with an organic light emitting layer 432 and encapsulated by tetrafluoroethylene (TFE).

A color shifting layer 450 is arranged at a side of the flexible substrate 431 facing an interior of the electronic device (not illustrated in the drawings), that is, the color shifting layer 450 is arranged at a lower surface of the flexible substrate 431. The position of the color shifting layer 450 corresponds to that of a fingerprint collection component 460. Other portions of the flexible substrate 431 (all the other regions except the one corresponding to the color shifting layer) are coated with a reflective material to form a reflective layer 470. In order to ensure that the color shifting layer 450 can completely cover a light-transparent hole 480 formed in the auxiliary material 440 for allowing the light emitted by the fingerprint collection component 460 to pass therethrough, the reflective layer 470 and the color shifting layer 450 may have an overlapping region (not illustrated in the drawings). For example, the color shifting layer 450 and the reflective layer around the circumference of the light-transparent hole 480 overlap partially.

The color shifting layer 450 of this embodiment is made of the ultraviolet photochromic material, for example an organic photochromic material containing spiropyran. When the display screen receives the strong light in the outdoor environment, much ultraviolet light is received, then the organic photochromic material absorbs the ultraviolet light and the photochromic reaction of the color shifting layer 450 is excited. Thus, the color shifting layer 450 is in an excited state, that is, a highly reflective state. In the excited state, the color shifting layer 450 is a reflective layer having a high reflectivity, such that when the display screen is observed by the user under the strong light, there is little light-dark difference between the region where the color shifting layer 450 is and the region coated by the reflective material, which avoids the dark spot at the collection region and improves the visible aesthetics of the display screen under the light.

When the user needs to have a fingerprint unlocking, a fingerprint payment and other operations under a strong light, the user can press the finger on a preset region of the display screen. Since the preset region has a position corresponding to those of the fingerprint collection component and the light-transparent hole, the user's finger blocks the ultraviolet light incident on the color shifting layer through the light-transparent hole, such that the color shifting layer cannot receive enough ultraviolet light, and switches from the excited state with the high reflectivity to the unexcited state with the high light transmittance within 0.5 to 1 second. In the unexcited state, the fingerprint collection component emits light for collecting fingerprint information, the light shines on the user's finger, and the fingerprint information is determined according to the reflected information, thus completing the operations such as the fingerprint unlocking or the fingerprint payment.

The present disclosure also provides an electronic device, and the electronic device may be a terminal device such as a mobile phone, a tablet computer, or a smart wearable device. The electronic device includes an OLED screen, and the OLED screen may be a rigid OLED display or a flexible OLED screen.

The electronic device is provided with the above display screen and the fingerprint collection component is arranged under the display screen of the electronic device. The electronic device of the present disclosure can effectively avoid the display dark spot in the region corresponding to the fingerprint collection component when the display screen of the electronic device is in the outdoor sunlight, thus enhancing the brand image and expanding the brand awareness.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, it is to be understood that the terms "lower," "upper," "under" or "beneath" or "underneath," "above," "front," "back," "left," "right," "top," "bottom," "inner," "outer," "horizontal," "vertical," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

In the description of the present disclosure, the terms "some embodiments," "example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombinations.

Moreover, although features can be described above as acting in certain combinations and even initially claimed as such, one or more features from a claimed combination can in some cases be excised from the combination, and the claimed combination can be directed to a subcombination or variations of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

What is claimed is:

1. An electronic device having an under-screen fingerprint collection component, comprising a display screen and interior components under the display screen, the display screen comprising:
   a substrate; and
   a color-shifting layer arranged over the substrate, the color shifting layer being made of a photochromic material,
   wherein the color shifting layer covers at least a region of the substrate corresponding to the under-screen fingerprint collection component;
   the display screen is an organic light-emitting diode (OLED) display screen;
   the color shifting layer is arranged at a side of the substrate facing the interior components; and
   the color shifting layer is transparent and colorless when not excited, and becomes reflective when excited by an ultraviolet light in sunlight, so as to avoid a dark spot at the region of the substrate corresponding to the under-screen fingerprint collection component when the mobile terminal is being used in the sunlight.

2. The electronic device according to claim 1, wherein the color shifting layer is made of an organic photochromic material containing spirooxazine.

3. The electronic device according to claim 1, wherein the color shifting layer is made of an organic photochromic material containing spiropyran.

4. The electronic device according to claim 1, wherein the color shifting layer is disposed on the substrate by vacuum evaporation.

5. The electronic device according to claim 1, wherein
the display screen further comprises a display panel;
the display panel comprises a display encapsulation layer and the substrate;
the substrate is arranged at a side of the display encapsulation layer facing an interior of the electronic device,
the color shifting layer is arranged at a side of the substrate facing the interior of the electronic device.

6. The electronic device according to claim 5, wherein
the display screen is a rigid OLED screen;
the rigid OLED screen comprises a first glass substrate and a second glass substrate;
the display encapsulation layer is arranged between the first glass substrate and the second glass substrate;
the second glass substrate is arranged at the side of the display encapsulation layer facing the interior of the electronic device; and
the color shifting layer is provided at a side of the second glass substrate facing the interior of the electronic device.

7. The electronic device according to claim 5, wherein
the display screen is a flexible OLED screen;
the flexible OLED screen comprises a flexible substrate; and
the color shifting layer is arranged at a side of the flexible substrate facing the interior of the electronic device.

8. The electronic device according to claim 5, wherein
a reflective layer is arranged at a side of the display panel facing the interior of the electronic device; and
the reflective layer and the color shifting layer have an overlapping region.

* * * * *